(12) United States Patent
Kitamura

(10) Patent No.: US 7,453,204 B2
(45) Date of Patent: Nov. 18, 2008

(54) LIGHT EMITTING ELEMENT WITH LIGHT-EMITTING MATERIAL IN DIFFERENT CONCENTRATIONS

(75) Inventor: Yoshitaka Kitamura, Kanagawa (JP)

(73) Assignee: Fujifilm Corporation, Kanagawa (JP)

( * ) Notice: Subject to any disclaimer, the term of this patent is extended or adjusted under 35 U.S.C. 154(b) by 485 days.

(21) Appl. No.: 11/033,878

(22) Filed: Jan. 13, 2005

(65) Prior Publication Data

US 2005/0184655 A1    Aug. 25, 2005

(30) Foreign Application Priority Data

Jan. 16, 2004 (JP) ............................. 2004-009591
Dec. 21, 2004 (JP) ............................. 2004-369327

(51) Int. Cl.
*H01J 1/62* (2006.01)
*H01J 63/04* (2006.01)

(52) U.S. Cl. ...................... 313/506; 313/498; 313/512

(58) Field of Classification Search ................ 313/498, 313/503, 504, 506, 512
See application file for complete search history.

(56) References Cited

U.S. PATENT DOCUMENTS 5,935,720 A       8/1999   Chen et al.
2003/0068525 A1*  4/2003   Bellmann et al. ............ 428/690

FOREIGN PATENT DOCUMENTS

JP    10-308281 A    11/1998
JP    2003-187977 A   7/2003
WO    WO-01/08230 A1  2/2001

* cited by examiner

*Primary Examiner*—Karabi Guharay
*Assistant Examiner*—Kevin Quarterman
(74) *Attorney, Agent, or Firm*—Birch, Stewart, Kolasch & Birch, LLP

(57) ABSTRACT

The present invention provides a light emitting element comprising a pair of electrodes and one or more organic compound layers including a luminescent layer disposed between the pair of electrodes. In this structure, the luminescent layer includes at least one charge transport material and at least one light emitting material, and comprises a laminated structure having two or more laminates including a plurality of layers including the light emitting material in different concentrations.

15 Claims, 4 Drawing Sheets

LIGHT EMITTING ELEMENT WITH LIGHT-EMITTING MATERIAL IN DIFFERENT CONCENTRATIONS

CROSS-REFERENCE TO RELATED APPLICATION

This application claims priority under 35USC 119 from Japanese Patent Application Nos. 2004-9591 and 2004-369327, the disclosure of which are incorporated by reference herein.

BACKGROUND OF THE INVENTION

1. Field of the Invention

The present invention relates to a light emitting element. In particular, the invention relates to an organic electroluminescent element (organic El element) capable of obtaining high-efficiency, longer-wavelength emission in a red light emitting element.

2. Description of the Related Art

When an electric field is applied to both electrodes of an organic EL element, electrons are injected thereto form a cathode and holes are injected thereto form an anode. These electrons and holes recombine in a luminescent layer to release energy as light when the electron undergo the transition from the conduction band to the valence band, which causes the organic EL element to emit light.

When an organic EL element is utilized as a full color display, the EL element needs to have red, green and blue (RGB) light emitting materials that offer appropriate chromaticity and sufficient luminance efficiency. For the achievement of this object, a system in which a variety of light emitting materials providing a desired color are doped in charge transport materials having optimum transport and luminescence properties has been used.

Preferable red light emitting materials for a luminescent layer used in the above-described system include, for example, a 4H-pyranylidenepropanedinitrile derivative disclosed in Japanese Patent Application Laid-Open (JP-A) No. 10-308281. This compound exhibits an emission peak at a relatively long wavelength and provides red emission of high luminance efficiency. Even using these compounds, however, does not provide a sufficient peak value of a luminescence wavelength from the standpoint of color, and thus a material is presently required that exhibits high luminance efficiency and emits light at a longer wavelength.

Examples of a luminescent layer of a light emitting element, in which the layer adopts a laminated structure with repeating units, include those of JP-A No. 2003-187977 and International Publication WO01/08230A1. JP-A No. 2003-187977 describes an organic EL element wherein the element has three or more luminescent layers alternately laminated, and the luminescent layers emit beams of different peak wavelengths. More specifically, this document relates to a white light emitting element having both yellow light emitting material layers of rubrene and blue light emitting material layers of perylene alternately laminated three or more times each. Also, International Publication WO01/08230A1 discloses, as a luminescent layer having a laminated structure having repeating units, a luminescent layer that has both a luminescent layer comprising a light emitting material (DCM2) radiating red fluorescence and a luminescent layer comprising a triplet radiative indium complex alternately laminated.

SUMMARY OF THE INVENTION

The present invention has been made in view of the above-circumstances and provides a light emitting element which exhibits an emission peak at a longer wavelength as well as high quantum efficiency of emission and which is suitable for a red light emission element.

An aspect of the invention is to provide a light emitting element comprising a pair of electrodes and one or more organic compound layers including a luminescent layer disposed between the pair of electrodes. The luminescent layer includes at least one charge transport material and at least one light emitting material, and comprises a laminated structure having two or more laminates including a plurality of layers including the light emitting material in different concentrations.

DETAIL DESCRIPTION OF THE INVENTION

Hereinafter, the light emitting elements of the present invention will be described in detail.

The present invention relate to a light emitting element comprising a pair of electrodes and one or more organic compound layers including a luminescent layer disposed between the pair of electrodes. The luminescent layer includes at least one charge transport material and at least one light emitting material, and comprises a laminated structure having two or more laminates including a plurality of layers including the light emitting material in different concentrations.

Figure 1:
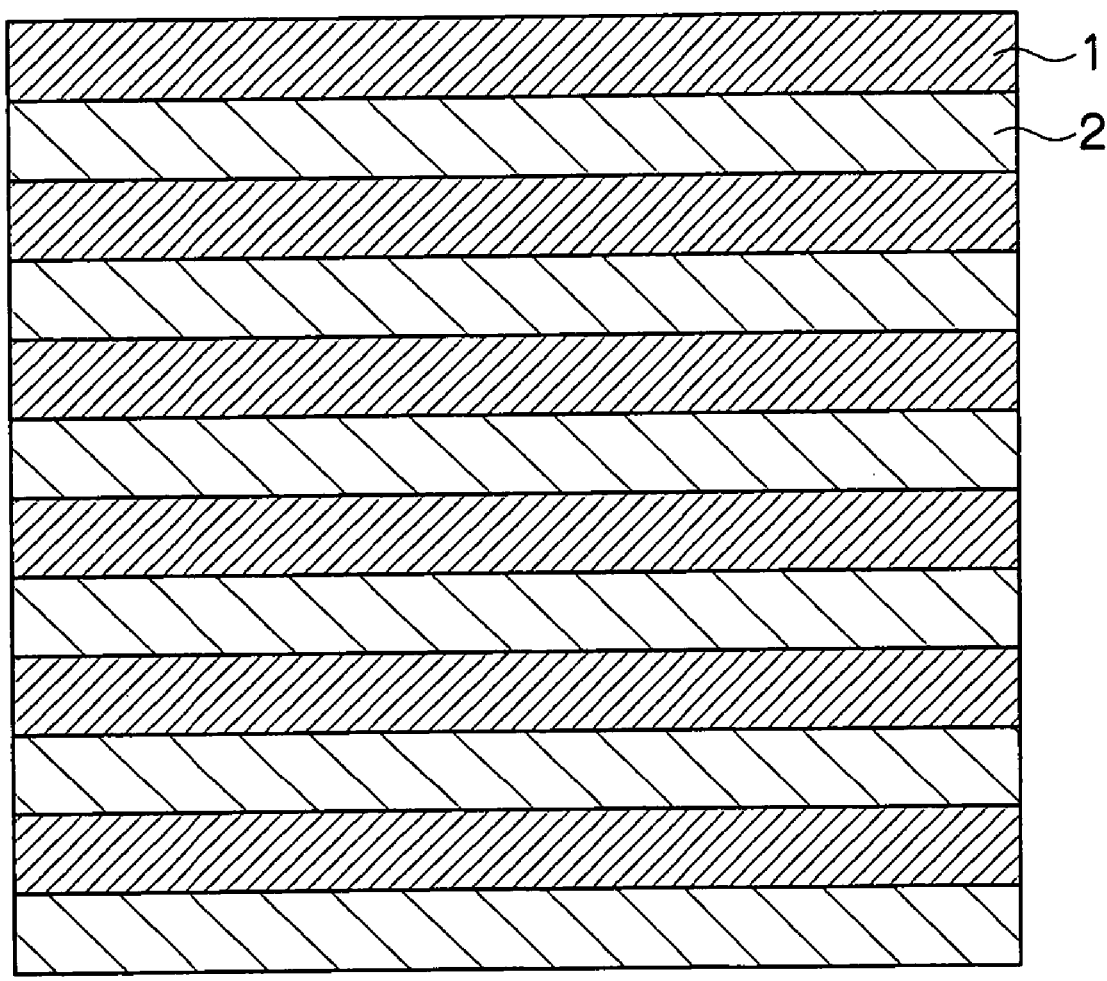
FIG. 1 is a drawing indicating a form of a luminescent layer comprising a laminate (high and low concentration layers) including a plurality of layers including a light emitting material in different concentrations.
Figure 2:
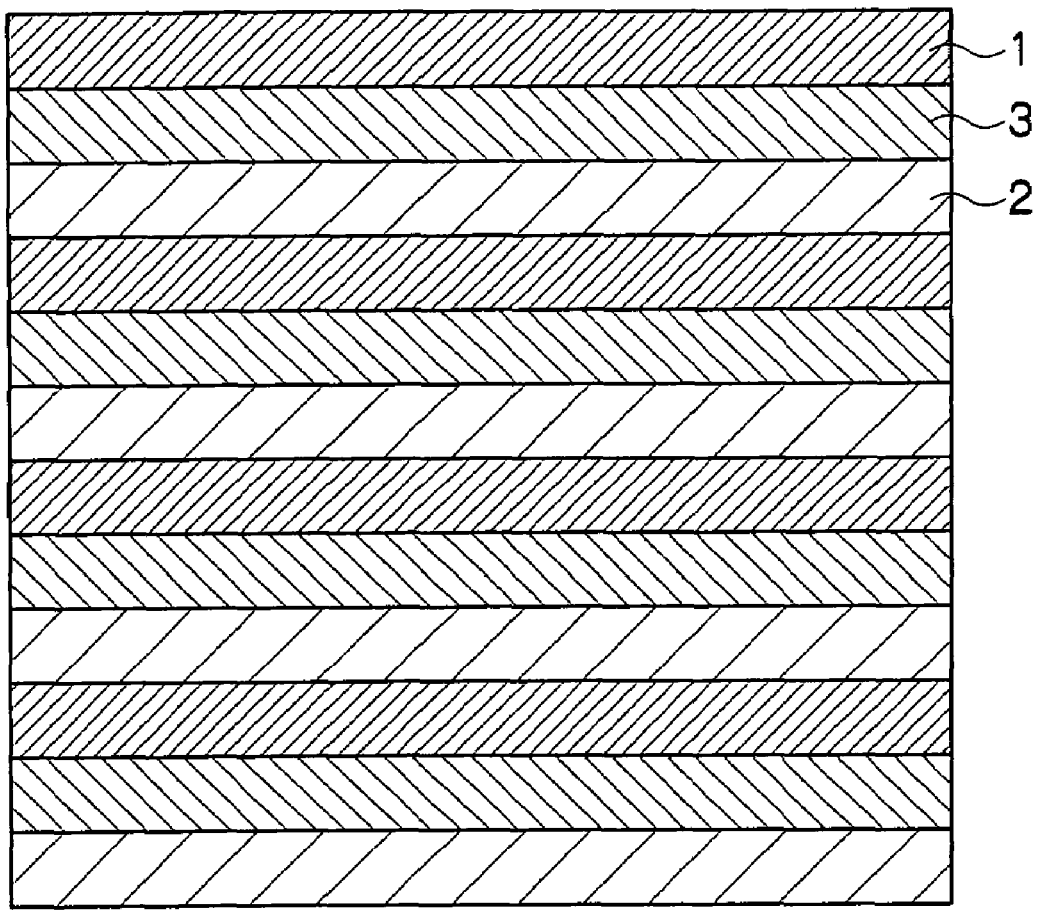
FIG. 2 is a drawing indicating a form of a luminescent layer comprising a laminate (high, intermediate and low concentration layers) including a plurality of layers including a light emitting material in different concentrations.
Figure 3:
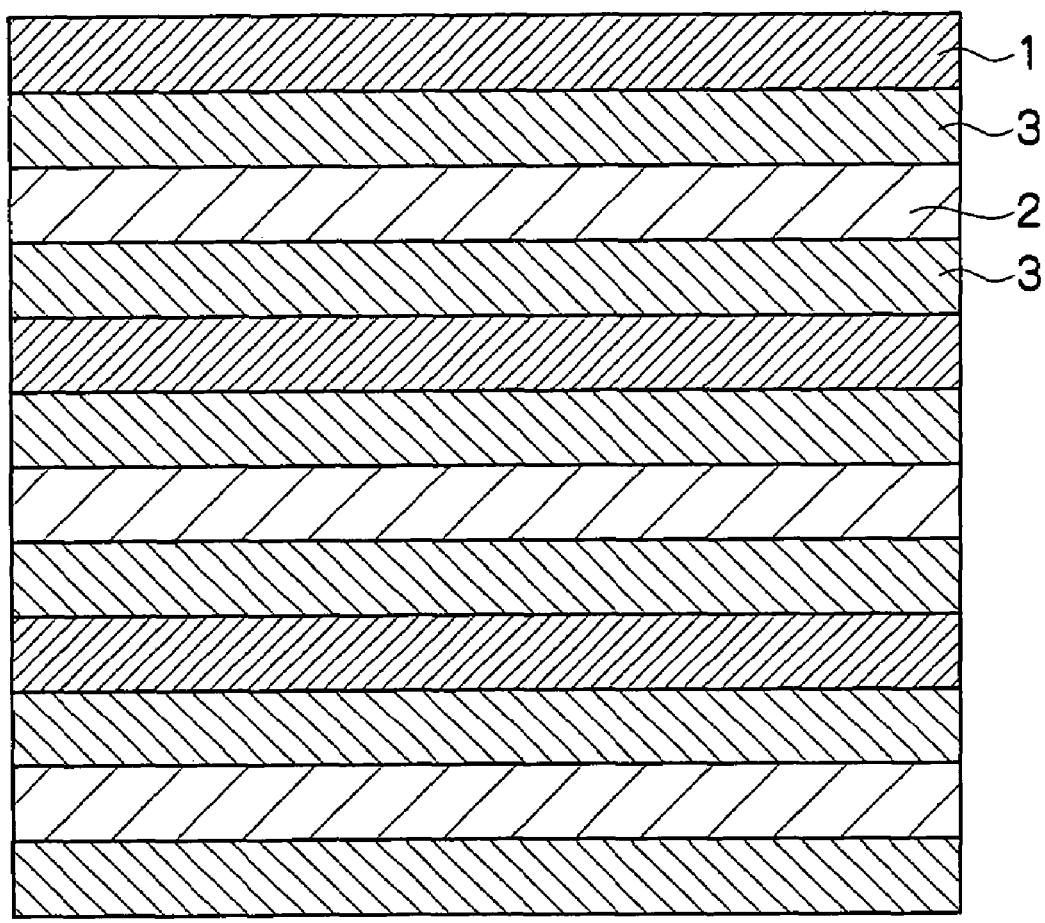
FIG. 3 is a drawing indicating a form of a luminescent layer comprising a laminate (high, intermediate, low and intermediate concentration layers) including a plurality of layers including a light emitting material in different concentrations.

In the invention, the laminate including a plurality of layers including the light emitting material in different concentrations may comprise a two-layer laminate having high (1) and low (2) concentration layers as illustrated in, for example, FIG. 1. Also, the laminate may comprise a three-layer laminate having high (1), intermediate (3) and low (2) concentration layers as illustrated in FIG. 2, or having high, low and intermediate concentration layers. Furthermore, the laminate may comprise a four-layer laminate as illustrated in FIG. 3, in which (1) is a high concentration layer, (2) is a low concentration layer, and both layers identified as (3) are intermediate concentration layers, or a more than four-layer laminate. Among these laminates (repeating units), preferable examples include a two-layer laminate having layers including the light emitting material of high and low concentrations. Further, in the laminate, the concentration of the light emitting material in a highest concentration layer including the light emitting material is preferably at least twice that of a lowest concentration layer, more preferably at least five times. More preferably, a laminate simultaneously satisfies a structure comprising two layers of high and low concentration layers as well as the concentration of the light emitting material in the highest concentration layer is at least twice that of the lowest concentration layer.

The number of laminates (number of repeating units) in a light emitting element of the invention is preferably from 2 to 50, more preferably from 3 to 25, and particularly preferably from 5 to 10, both inclusive. When the number of laminates exceeds 50, the thickness of the entire luminescent layer is increased, thereby leading to a decrease in efficiency in some cases. If the number of laminates is 2 or more, the efficiency is promoted and also it is easy to obtain a desired wavelength due to the shift of the luminescence wavelength to a longer wavelength.

In a light emitting element comprising a luminescent layer that does not utilize a laminated structure like the invention, i.e. an element comprising a luminescent layer of a one-layer structure, when a red light emitting material such as described in JP-A No. 10-308291 described above is used, increasing the concentration of the emitting material makes it possible to sufficiently move the luminescence wavelength to a longer wavelength, however the quantum efficiency of luminescence decreases. In contrast, the use of a emitting material in the concentration range without a decrease in quantum efficiency does not sufficiently cause the luminescence wavelength to be a long wavelength.

In the invention, causing a luminescent layer to be a laminated structure comprising a laminate including a plurality of layers including the light emitting material in different concentrations simultaneously permits efficiency and light emission of a sufficiently long wavelength even though only one kind of emitting material is employed.

Figure 4:
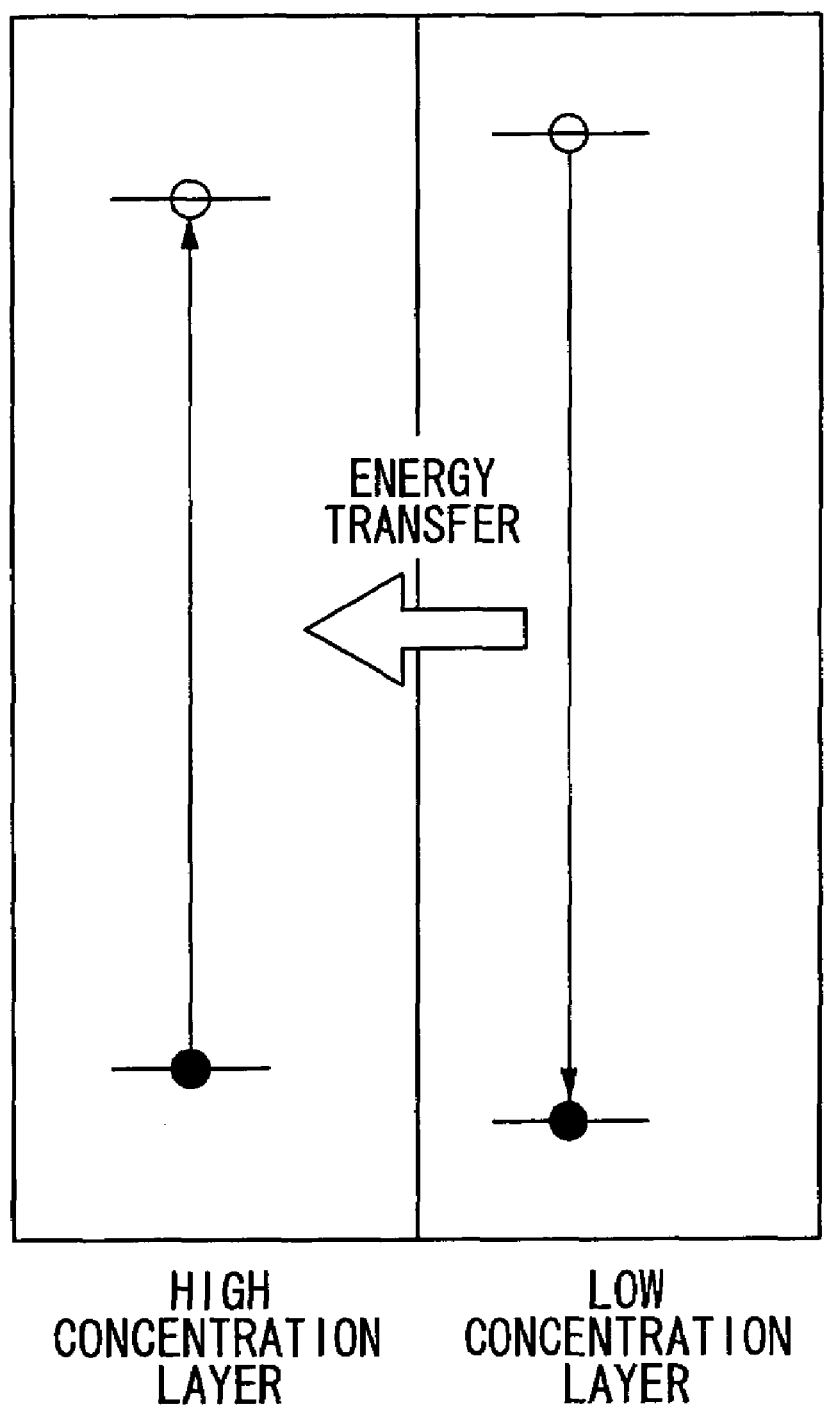
FIG. 4 is a schematic diagram illustrating an energy transfer in a luminescent layer.

The studies of the inventors have shown that the adoption of a structure having repeating units, which comprise a layer including the light emitting material in a low concentration material (low concentration layer) and a layer including the light emitting material in a high concentration (high concentration layer), can provide a red light emitting element that exhibits both high efficiency, a feature of a low concentration layer, and light emission of a long wavelength, a feature of a high concentration layer at the same time. The reason is not definitely obvious why the element that has these preferred properties is obtained, however, it is estimated that a high energy singlet exciton efficiently generated in the low concentration layer transfers energy to an emitting material within the high concentration layer leading to efficient generation of a low energy singlet exciton, thereby giving an element simultaneously showing high luminescence efficiency and light emission of a long wavelength (refer to FIG. 4).

Although JP-A No. 2003-187977 and International Publication WO01/08230A1 were indicated as related arts in which laminated structures are adopted to a luminescent layer of a light emitting element, the light emitting elements disclosed in these related arts have completely different concepts from that of the light emitting element of the invention.

That is, the light emitting element described in JP-A No. 2003-187977 is a light emitting element having luminescent layers that light-emit different peak wavelengths alternately laminated three or more times each, and the element is directed to making small the chromaticity change even when the light emitting center is moved. Hence, the object thereof quite differs from that of the light emitting element of the invention, which simultaneously obtains light emission of a long wavelength and high efficiency.

The light emitting element described in International Publication WO01/08230A1 is a product having a luminescent layer including an emitting material (DCM2) that emits red fluorescence and a luminescent layer including a triplet radiative iridium complex alternately laminated; the element utilizes the energy transfer of an intersystem crossing type from a triplet exciton generated in the Ir complex to a DCM2 exciton. This light emitting element is different from a light emitting element of the invention wherein attention is given to the concentration difference of a light emitting material in that the former has different emitting materials alternately repeatedly laminated.

In the light emitting element of the invention, the concentration of the light emitting material is preferably from 0.01% to 5%.

The laminate constituting the luminescent layer preferably has laminated layers of light emitting materials of high and low concentrations. The concentration of the high concentration layer is preferably from 0.1% to 5%; the concentration of the low concentration layer is preferably from 0.01% to 2%, more preferably from 0.01% to 1%.

The concentration of a high concentration layer is preferably twice or more those of adjacent low concentration layers.

The thicknesses of high and low concentration layers are each preferably from 1 nm to 10 nm, more preferably from 2 nm to 5 nm.

The total thickness of a luminescent layer is preferably from 10 nm to 100 nm, more preferably from 20 nm to 50 nm.

The laminate constituting the luminescent layer may be a laminate having layers of the same thickness, or may be a laminate having layers of different thicknesses as well.

Next, the constitution of a light emitting element of the invention will described in detail.

The light emitting element of the invention is a light emitting element that forms a luminescent layer or a plurality of layers including a luminescent layer between a pair of electrodes on a substrate. The pair of electrodes stands for an anode and a cathode, and at least one electrode is transparent in terms of characteristics of a light emitting element. For the usual case, an anode is transparent.

Between both electrodes are laminated a hole transporting layer, a luminescent layer and an electron transporting layer in this order from the anode side. The hole transporting layer, the luminescent layer and the electron transporting layer are called organic compound layers because the layers thereof are primarily composed of organic compounds. More specifically, examples of the constitution include from the substrate side a transparent anode/a luminescent layer/a cathode, a transparent anode/a luminescent layer/an electron transporting layer/a cathode, a transparent anode/a hole transporting layer/a luminescent layer/an electron transporting layer/a cathode, a transparent anode/a hole transporting layer/a luminescent layer/a cathode, and the like.

Additionally, each layer may also be separated into a plurality of secondary layers. A charge block layer or the like may also be present between a hole transporting layer and a luminescent layer, or between a luminescent layer and an electron transporting layer. A hole injecting layer may also be present between an anode and a hole transporting layer; an electron injecting layer may also be present between a cathode and an electron transporting layer.

The light emitting element of the invention preferably includes at least a hole transporting layer, a luminescent layer and an electron transporting layer from the viewpoint of durability and emission efficiency.

Next, constituents constituting a light emitting element of the invention will described in detail.

Substrate

A substrate to be used in the invention is preferably a substrate that does not scatter or attenuate light emitted from an organic compound layer. Specific examples of the substrate include inorganic materials such as Yttria-stabilized Zirconia (YSZ) and glass; polyesters such as polyethylene terephthalate, polybutylene phthalate, and polyethylene naphthalate; and organic materials such as polystyrene, polycarbonate, polyether sulfone, polyallylate, polyimides, polycycloolefins, norbornene resin, and poly(chlorotrifluoroethylene). When the organic material is used, the material is preferably excellent in heat resistance, dimension stability, solvent resistance, electric insulation and processability.

The shape, structure, size and the like of a substrate are not particularly limited and can be selected as appropriate depending on applications, aims and the like of a light emitting element. In general, the shape is board-shaped. The structure of the light emitting element may be a single-layer structure or may also be a laminated structure. The substrate may be fabricated with a single member or may also be formed with two or more members.

The substrate may be colorless transparent or may also be colored transparent, and is preferably colorless transparent in terms of no scattering or attenuation of the light emitted from the luminescent layer.

A moisture penetration resistance layer (gas barrier layer) can be formed on the surface or the back (the aforementioned transparent electrode side) of the substrate. Materials for the moisture penetration resistance layer (gas barrier layer) that are suitably used include inorganic substances such as silicon nitrate and silicon oxide. The moisture penetration resistance layer (gas barrier layer) can be formed by, for example, the radio-frequency (high-frequency) sputtering process or the like.

When a thermoplastic substrate is used, the substrate may be equipped with a hard coat layer or an undercoat layer further as required.

Anode

The anode may usually serve as an anode that supplies holes to the organic compound layer. The shape, structure, size and the like of the anode are not particularly limited and can be selected as appropriate from well known electrodes depending on applications and aims of a light emitting element. As mentioned supra, the anode is usually formed as a transparent anode.

Materials constituting the anode that are suitable include, for example, metals, alloys, metal oxides, electric conductive organic compounds and mixtures thereof, and preferably have a work function of 4.0 eV or more. Specific examples include semiconductive metal oxides such as tin oxides doped with antimony or fluorine (ATO, FTO), tin oxide, zinc oxide, indium oxide, indium tin oxide (ITO), and indium zinc oxide (IZO); metals such as gold, silver, chromium, and nickel; mixtures or laminates of these metals and electric conductive metal oxides; electric conductive inorganic substances such as copper iodide and copper sulfate; electric conductive organic materials such as polyaniline, polythiophene, and polypyrrole; laminates and the like of these and ITO.

An anode can be formed on the above-described substrate in accordance with a method selected, as appropriate, in consideration of fitness for materials constituting the above-described anode, from wet methods such as the printing method and the coating method, physical methods such as the vacuum deposition method, the sputtering method and the ion plating method, chemical methods such as CVD and the plasma CVD method, and the like. For instance, when ITO is selected as the material of the anode, the formation of the anode can be carried out according to the direct current or high-frequency sputtering method, the vacuum deposition method, the ion plating method or the like. When an organic electric conductive compound is selected as the material of the anode, the formation can be conducted in accordance with the wet deposition process.

In the light emitting element of the invention, the position of the anode to be formed is not particularly limited and can be selected as necessary depending on applications or aims of the light emitting element. Preferably, the anode is formed on the above-described substrate. In this case, the anode may be formed on the entire surface of one surface of the substrate, or may also be formed on a portion thereof.

The patterning of the anode may be carried out by chemical etching such as photolithography, or may also be carried out by physical etching such as by means of a laser, or may also be carried out by vacuum deposition or sputtering after mask putting up, or may also be carried out by the lift-off method or the printing method.

The thickness of the anode can be selected, as appropriate, depending on a material constituting the above-described anode, cannot be specified unconditionally, is usually from 10 nm to 50 μm, and is preferably from 50 nm to 20 μm.

The resistance value of the anode is preferably $10^3 \Omega$/sq or less, more preferably $10^2 \Omega$/sq or less. When the anode is a transparent anode, the anode may be colorless transparent or may also be colored transparent. For the extraction of light emission from the anode side, the transmittance is preferably 60% or more, more preferably 70% or more.

Additionally, transparent anodes are described in detail in "Tohmeidenkyokumaku No Shinhatten (New Development of Transparent Electrode Films)" supervised by Yutaka Sawada, published by CMC (1999), anodes thereof being capable of application. When a plastic substrate of low heat resistance is used, ITO or IZO is employed, and a transparent anode is preferable that is film formed at a low temperature of 150° C. or less.

Cathode

The cathode may usually serve as a cathode that injects an electron to an organic compound layer. The shape, structure, size and the like are not particularly limited and can be selected as appropriate from well known electrodes depending on applications and aims of a light emitting element.

Materials constituting the cathode include, for example, metals, alloys, metal oxides, electric conductive compounds and mixtures thereof, and preferably have a work function of 4.5 eV or less. Specific examples include alkali metals (e.g., Li, Na, K, Cs and the like), alkali earth metals (e.g., Mg, Ca, and the like), gold, silver, lead, aluminum, sodium-potassium alloy, lithium-aluminum alloy, magnesium-silver alloy, indium, rare earth metals such as ytterbium, and the like. These may be used singly and can be used in combination of two or more species from the standpoint of compatibility between stability and electron injection properties.

Among them, preferable examples include alkali metals and alkali earth metals in terms of electron injection properties and include materials primarily made of aluminum in terms of excellent shelf life.

The material primarily made of aluminum means aluminum alone, or an alloy of aluminum and a 0.01 to 10% by mass alkali metal or alkali earth metal or a mixture thereof (e.g., lithium-aluminum alloy, magnesium-aluminum alloy, and the like).

In addition, materials of the cathode are described in JP-A Nos. 2-15595 and 5-121172 and the materials described in these gazettes can also be applied to the invention.

Methods of forming the cathode are not particularly limited and can be carried out in accordance with a well known methods. For instance, a cathode can be formed in accordance with a method selected, as appropriate, in consideration of fitness for materials constituting the above-described cathode, from wet methods such as the printing method and the coating method; physical methods such as the vacuum deposition method, the sputtering method and the ion plating method; chemical methods such as CVD and the plasma CVD method; and the like. For example, when metals and the like are selected as materials of the cathode, the formation can be carried out with one species thereof or two or more species thereof at the same time or one by one in accordance with the sputtering method or the like.

The patterning of the cathode may be carried out by chemical etching such as photolithography, or may also be carried out by physical etching such as by means of a laser, or may also be carried out by vacuum deposition or sputtering after mask piling up, or may also be carried out by the lift-off method or the printing method.

In the light emitting element of the invention, the position of a cathode to be formed is not particularly limited and may be formed on the entire organic compound layer, or may also be formed on a portion thereof.

Also, in between the cathode and the organic compound layer may be inserted a dielectric layer with a thickness of 0.5 to 5 nm made of a fluoride or an oxide of an alkali metal or an alkali earth metal, etc. This dielectric layer can be considered a kind of electron injecting layer. The dielectric layer can be formed by, for example, the vacuum deposition method, the sputtering method, the ion plating method or the like.

The thickness of a cathode can be selected, as appropriate, depending on a material constituting the above-described cathode, cannot be specified unconditionally, is normally from 10 nm to 5 μm, and is preferably from 50 nm to 1 μm.

The cathode may be transparent or may also be opaque. A transparent cathode can be formed by a process that involves thinly film-forming a material constituting the above-described cathode to a thickness of from 1 to 10 nm, and then laminating a transparent, electric conductive material of the aforementioned ITO, IZO, or the like.

Organic Compound Layer

Formation of an Organic Compound Layer

The organic compound layer in the invention is composed with the inclusion of a luminescent layer and may also have other layers, mainly composed of an organic compound, including a hole injecting layer, a hole transporting layer, an electron injecting layer, an electron transporting layer, and the like. As described above, the organic compound layer in the invention preferably includes at least a hole transporting layer, a luminescent layer and an electron transporting layer.

In the light emitting element of the invention, each layer constituting the organic compound layer can appropriately be formed by even any of dry film-forming methods such as the evaporation method and sputtering method; wet film-forming methods such as dipping, the spin coating method, the dip coating method, the cast method, the die coating method, the roll coating method, the bar coating method, and the gravure coating method; the transfer method; the printing method; and the like.

Luminescent Layer

The luminescent layer is a layer that, when an electric field is applied, serves as receiving a hole from an anode, a hole injecting layer or a hole transporting layer, receiving an electron from a cathode, an electron injecting layer or an electron transporting layer, providing a place of recombination of the hole and the electron, thereby emitting light.

The luminescent layer in the invention is a mixed system of a charge transport material and a light emitting material. In the invention, a charge transport material may be a single system or a mixed system of a plurality of species as well. A light emitting material may also be a single system or a mixed system of a plurality of species.

In the invention, the light emitting material contained in each layer constituting the laminated structure of the luminescent layer uses the same light emitting material (single system or mixed system of a plurality of species) and is produced by alteration of the concentration of each layer. From the viewpoint of efficacy, an embodiment is more preferable that uses a single light emitting material. In this preferable embodiment, only one kind of material is included as the light emitting material, and two or more kinds of materials which do not contribute to light emission may be included.

In the invention, the mixing ratio (mass ratio) of a charge transport material to a light emitting material is not particularly limited and is preferably from 10000:1 to 100:20, more preferably 10000:1 to 100:5, particularly preferably from 10000:5 to 100:2.

Examples of charge transport materials that can be used in the invention include benzoxazole, benzimidazole, benzothiazole, styryl benzene, polyphenyl, diphenylbutadiene, tetraphenylbutadiene, naphthalimide, coumarin, pyrene, perylene, perinone, oxadiazole, aldazine, pyralyzine, cyclopentadiene, bisstyrylanthracene, quinacridone, pyrrolopyridine, thiadiazopyridine, cyclopentadiene, styrylamine, aromatic dimethylidyne compounds, quinacridone, various metal complexes and the like represented by metal complexes of 8-quinolinol and rare earth complexes, polymer compounds such as polythiophene, polyphenylene and polyphenylenevinylene, organic silanes, and derivatives of these compounds, and the like. Among them, preferable examples include styryl benzene derivatives, pyrene derivatives, and metal complexes of 8-quinolinol. Examples of preferable metals of metal complexes of 8-quinolinol include aluminum, gallium and zinc.

The charge transport material may be composed of materials of two or more species, and may be a mixture of a hole transport material including 4,4'-bis[N-(1-naphthyl)-N-phenyl-amino]biphenyl and an electron transport material including tris(8-hydroxyquinolinate) aluminum.

The light emitting material is not particularly limited and may be either a fluorescence emitting compound emitting from a singlet exciton or a phosphorescence emitting compound emitting from a triplet exciton. A fluorescence emitting compound and/or a phosphorescence emitting compound having a maximum peak emission of from 570 nm to 700 nm are preferable.

Examples of light emitting materials that can be used in the invention include benzoxazole derivatives, benzimidazole derivatives, benzothiazole derivatives, styryl benzene derivatives, polyphenyl derivatives, diphenylbutadiene derivatives, tetraphenylbutadiene derivatives, naphthalimide derivatives, coumarin derivatives, condensed aromatic compounds, perinone derivatives, oxadiazole derivatives, oxazine derivatives, aldazine derivatives, pyralyzine derivatives, cyclopentadiene derivatives, bisstyrylanthracene derivatives, quinacridone derivatives, pyrrolopyridine derivatives, thiadiazopyridine derivatives, cyclopentadiene derivatives, styrylamine derivatives, diketopyrrolopyrrole derivatives, aromatic dimethylidyne compounds, various metal complexes and the like represented by metal complexes of 8-quinolinol derivatives, and metal complexes, rare earth complexes and transition metal complexes, of pyrromethene derivatives, polymer compounds such as polythiophene, polyphenylene and polyphenylenevinylene, compounds such as organic silane derivatives, and the like.

The light emitting materials which are preferably used in the invention include those described in the following document (<1> to <58>).

<1> The compounds represented by general formulae (1), (2), (5) and (8), and/or by chemical formula (1-1) in paragraph (0034) to chemical formula (1-37) in paragraph (0039), which are described in Japanese Patent Application Laid-Open (JP-A) No. H11-193351.

<2> The compounds represented by general formula (1) and/or by compound 1 in paragraph (0024) to compound 20 in paragraph (0028), which are described in JP-A No. H11-292875.

<3> The compounds represented by general formulae (I) and (I-a) to (I-e), and/or by compound 1 in paragraph (0042) to compound 73 in paragraph (0059), which are described in JP-A No. H11-335368.

<4> The compounds represented by general formulae (I) to (IV) and/or by compound 1 in paragraph (0044) to compound 41 in paragraph (0054), which are described in JP-A No. H11-335661.

<5> The compounds represented by general formulae (1) to (5) and/or by chemical formula D-1 in paragraph (0032) to chemical formula D-53 in paragraph (0040), which are described in JP-A No. 2000-80088.

<6> The compounds represented by general formula (I) and/or by compound 1 in paragraph (0024) to chemical formula 25 in paragraph (0030), which are described in JP-A No. 2000-351774.

<7> The compounds represented by general formula (A) and/or by chemical formula (D-1) in paragraph (0099) to chemical formula (D-46) in paragraph (0107), which are described in JP-A No. 2000-351965.

<8> The compounds represented by general formulae (I), (I-A) and (II), and/or by compound 1 in paragraph (0038) to chemical formula 117 in paragraph (0047), which are described in JP-A No. 2001-31961.

<9> The compounds represented by general formulae (I) to (IV) and/or by compound 1 in paragraph (0074) to chemical formula 326 in paragraph (0092), which are described in JP-A No. 2001-81452.

<10> The compounds represented by general formula (I) and/or by chemical formula (D-1) in paragraph (0087) to chemical formula (D-36) in paragraph (0099), which are described in JP-A No. 2001-107037.

<11> The compounds having a partial structure represented by general formulae (1) to (10) or tautomers thereof, and/or compounds represented by chemical formula (1-1) in paragraph (0075) to chemical formula (1-70) in paragraph (0086), which are described in JP-A No. 2001-247859.

<12> The compounds represented by general formulae (I) and (II), and/or by chemical formula (D-1) in paragraph (0024) to chemical formula (D-30) in paragraph (0029), which are described in JP-A No. 2001-261677.

<13> The compounds represented by general formula (I) and/or by chemical formula (D-1) in paragraph (0040) to chemical formula (D-51) in paragraph (0049), which are described in JP-A No. 2001-273977.

<14> The compounds having a partial structure represented by general formulae (1) and (2)) and the compounds represented by formulae (3) and (4), and/or by chemical formula (1-1) in paragraph (0047) to chemical formula (1-20) in paragraph (0051), which are described in JP-A No. 2001-345183.

<15> The compounds represented by general formulae (I) and (IV), and/or by chemical formula (D-1) in paragraph (0103) to chemical formula (D-24) in paragraph (0107), which are described in JP-A No. 2001-354955.

<16> The compounds represented by general formulae (I) and/or (III), and/or by chemical formula (D-1) in paragraph (0036) to chemical formula (D-11) in paragraph (0039), which are described in JP-A No. 2002-80842.

<17> The compounds represented by general formulae (I) to (IV) and/or by chemical formula (D-1) in paragraph (0038) to chemical formula (D-78) in paragraph (0053), which are described in JP-A No. 2002-367783.

<18> The compounds represented by general formula (I) and/or by chemical formula (D-1) in paragraph (0032) to chemical formula (D-54) in paragraph (0043), which are described in JP-A No. 2003-36976.

<19> The compounds represented by general formula (I) and/or by chemical formula (D-1) in paragraph (0046) to chemical formula (D-18) in paragraph (0051), which are described in JP-A No. 2003-243177.

<20> The compounds represented by general formula (I) and/or by chemical formula (D-1) in paragraph (0053) to chemical formula (D-34) in paragraph (0065), which are described in JP-A No. 2003-308980.

<21> The compounds represented by general formulae (I) and (III), and/or by chemical formula (D-1) in paragraph (0052) to chemical formula (D-75) in paragraph (0063) and chemical formula (F-1) in paragraph (0065) to chemical formula (F-34) in paragraph (0068), which are described in JP-A No. 2004-6074.

<22> The metal complex having a partial structure represented by general formula (I) and the compounds represented by general formula (II) and/or chemical formula (D-1) in paragraph (0030) to chemical formula (D-19) in paragraph (0032), which are described in JP-A No. 2004-87390.

<23> The compounds represented by general formula 1 and/or by chemical formula 1 in paragraph (0014) to chemical formula 17 in paragraph (0031), which are described in JP-A No. 2001-329257.

<24> The compounds represented by general formula (1) and/or by chemical formulae (4) to (8) in paragraph (0030), which are described in JP-A No. 2002-237384.

<25> The compounds represented by general formula (1) and/or by chemical formulae (5) to (45), which are described in WO01/042218.

<26> The compounds represented by general formula (1) and/or by exemplary compounds No. 1 to No. 812, which are described in WO2002/044189.

<27> The compounds represented by general formulae [1] and [2], and/or by representative example (A-1) in paragraph (0013) to representative example (A-26) in paragraph (0017), which are described in JP-A No. 2001-102172.

<28> The compounds represented by general formulae [1] and [2], and/or by representative example (A-1) in paragraph (0014) to representative example (A-28) in paragraph (0018), which are described in JP-A No. 2001-102173.

<29> The compounds represented by general formulae [1] and [1], and/or by representative example (1) in paragraph (0015) to representative example (31) in paragraph (0020), which are described in JP-A No. 2001-102174.

<30> The compounds represented by general formulae [1] to [3] and/or by general formula (E-1) in paragraph (0011) to general formula (E-15) in paragraph (0014), which are described in JP-A No. 2002-105004.

<31> The compounds represented by general formula [1] and/or by compound (101) in paragraph (0010) to compound (714') in paragraph (0023), which are described in JP-A No. 2003-40845.

<32> The compounds represented by general formulae [1] to [18], and/or by representative examples (A-1) to (A-28) and (B-1) to (B-19), which are described in WO01/023497.

<33> The compounds represented by general formulae (1) to (9) and/or by compound 1-1 in paragraph (0024) to compound (9-22) in paragraph (0039), which are described in JP-A No. 2003-212875.

<34> The compounds represented by general formulae (1) to (11) and/or by compound 1-1 in paragraph (0017) to compound (11-12) in paragraph (0024), which are described in JP-A No. 2003-238516.

<35> The compounds represented by general formulae (1) and (2), and/or by compound P-1 in paragraph (0016) to compound P-25 in paragraph (0017), which are described in JP-A No. 2003-272866.

<36> The compounds represented by general formula (I) and/or by compound (1) in paragraph (0022) to compound (132) in paragraph (0027), which are described in JP-A No. H11-124572.

<37> The compounds represented by general formulae (1) to (3) and/or by compound No. 1 in paragraph (0017) to compound No. 53 in paragraph (0020), which are described in JP-A No. 2001-11079.

<38> The compounds represented by general formula (I) and/or by compound No. 1 in paragraph (0016) to compound No. 30 in paragraph (0018), which are described in JP-A No. 2001-11080.

<39> The compounds having a skelton shown by general formulae (1), and/or (2), and/or (3) or metal complexes thereof, and/or the compounds in paragraphs (0030) to (0036), which are described in JP-A No. 2000-208265.

<40> The compounds represented by general formulae (1) to (6), and/or the compounds in paragraphs (0039) to (0045), and/or by EM1 in paragraph (0067) to EM10 in paragraph (0088), which are described in JP-A No. 2001-297881.

<41> The compounds represented by general formulae (2) to (3) and/or the compounds in paragraphs (0035) to (0039), which are described in JP-A No. 2001-307884.

<42> The compounds represented by general formulae (1) to (3), and/or the compounds in paragraphs (0035) to (0037), and/or the compounds represented by D1 in paragraph (0050) and D2 in paragraph (0052), which are described in JP-A No. 2001-338764.

<43> The compounds represented by general formula (1) and/or the compounds in paragraphs (0025) to (0029), which are described in JP-A No. 2002-8861.

<44> The compounds described in paragraphs (0042), (0044), and (0046) of JP-A No. 2002-8862.

<45> The compounds represented by general formulae (1) and/or (4), and/or the compounds in paragraphs (0034) to (0039), and/or the compounds represented by DI in paragraph (0054) and/or D2 in paragraph (0056), which are described in JP-A No. 2002-8863.

<46> The compounds described in paragraphs (0019) to (0021) and/or paragraphs (0036) to (0040) of JP-A No. 2002-25771.

<47> The compounds represented by general formulae (1) to (3) and/or the compounds in paragraphs (0029) to (0035), which are described in JP-A No. 2002-134275.

<48> The compounds represented by general formula (1), and/or the compounds in paragraphs (0021) to (0023), and/or the compounds represented by DPT1 in paragraph (0035) and/or DPT2 in paragraph (0037), which are described in JP-A No. 2002-208487.

<49> The compounds having at least two substituents shown by general formula [1] and/or the compounds represented by compound (1) in paragraph (0067) to compound (33) in paragraph (0079), which are described in JP-A No. 2000-328052.

(50) The compounds shown by general formulae [1] to [2], which are described in JP-A No. 2001-207167.

<51> The compounds represented by general formula [1] and/or by compound (1) in paragraph (0043) to compound (60) in paragraph (0062), which are described in JP-A No. 2003-68462.

<52> The compounds represented by general formulae (1) and (3), and/or by compound (1) in paragraph (0062) to compound (88) in paragraph (0083), which are described in JP-A No. 2003-129043.

<53> The compounds represented by general formula (1) and/or by compound (1) in paragraph (0045) to compound (108) in (0071), which are described in JP-A No. 2003-201472.

<54> The compounds represented by general formula [1] and/or by compound (1) in paragraph (0039) to compound (32) in paragraph (0042), which are described in JP-A No. 2004-175674.

<55> The compounds represented by general formula (1) and/or the compounds in paragraph (0020), which are described in JP-A No. H11-329730.

<56> The compounds represented by general formula (1) and/or the compounds in paragraph (0020), which are described in JP-A No. H11-329731.

<57> The compounds represented by general formula (1) and/or the compounds in paragraph (0020), which are described in JP-A No. 2000-12225.

<58> The compounds represented by general formula (1) and/or the compounds in paragraph (0020), which are described in JP-A No. 2000-12226.

Formation of a luminescent layer comprised of a structure made by doping a light emitting material to a charge transport material may involve evaporating a charge transport material and a light emitting material at the same time, and then laminating the light emitting material on the substrate while the ratio of the light emitting material is regulated by control of the evaporation speed, may also involve applying by the spin coating method a solution prepared by dissolution of a guest material in a host material at an appropriate concentration, or may also involve using the spraying method, the ink jet method, or the like.

In the invention, the peak of a light emitting wavelength is preferably 570 nm or more.

Hole Injecting Layer and Hole Transporting Layer

The hole injecting layer or the hole transporting layer has the function of receiving a hole from an anode or an anode side and of transporting the hole to the cathode side.

The layers comprise films that include, for example, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted derivatives, styrylanthracene derivatives, fluorenone derivatives, hydrazone derivatives, stilbene derivatives, silazane derivatives, aromatic tertiary amino compounds, styrylamine compounds, aromatic dimethylidyne-based compounds, porphin-based compounds, polysilane-based compounds, poly(N-vinylcarbazole) derivatives, aniline-based copolymers, thiophene oligomers, and conductive high-moleculer oligomers such as polythiophene, organic silane derivatives, carbon, and the like.

The thickness of a hole injecting layer or a hole transporting layer is not particularly limited, but is preferably from 1 nm to 500 nm, more preferably from 5 nm to 200 nm, still more preferably from 10 nm to 100 nm. A hole injecting layer or a hole transporting layer may be a single layer structure comprising one species or two or more species of the aforementioned materials, or may also be a multilayer structure comprising a plurality of layers of the same composition or different compositions.

Electron Injecting Layer and Electron Transporting Layer

The electron injecting layer or the electron transporting layer has the function of receiving an electron from a cathode or a cathode side and of transporting the electron to the anode side.

Examples of substances constituting the layers include triazole derivatives, oxazole derivatives, oxadiazole derivatives, imidazole derivatives, fluorenone derivatives, anthraquinodimethane derivatives, anthrone derivatives, diphenylquinone derivatives, thiopyranedioxide derivatives, carbodiimide derivatives, fluorenylidenemethane derivatives, distyrylpyrazine derivatives, naphthalene, aromatic-ring tetracarboxylic anhydrides such as perylene, a variety of metal complexes presented by metal complexes of phthalocyanine derivatives and 8-quinolinol derivatives and metal complexes having as ligands metallophthalocyanine, benzooxazole and benzothiazole, organic silane derivatives, and the like.

The thickness of the electron injecting layer or the electron transporting layer is not particularly limited, but is preferably from 1 nm to 500 nm, more preferably from 5 nm to 200 nm, still more preferably from 10 nm to 100 nm. The electron injecting layer or the electron transporting layer may be a single layer structure comprising one species or two or more species of the aforementioned materials, or may also be a multilayer structure comprising a plurality of layers of the same composition or different compositions.

Protective Layer

In the invention, the whole light emitting element may be protected by a protective layer.

Any material may be used as the protective layer insofar as it has the ability to prevent the intrusion of materials, such as water and oxygen, which promote the deterioration of the element, into the element. Specific examples of the material of the protective layer include metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$, and $TiO_3$; metal nitrates such as SiNx and SiNxOy; metal fluorides such as $MgF_2$, LiF, $AlF_3$ and $CaF_2$; copolymers of polyethylene, polypropylene, polymethylmethacrylate, a polyimide, polyurea, polytetrafluoroethylene, polychlorofluoroethylene, polydichlorodifluoroethylene and chlorotrifluoroethylene with dichlorodifluoroethylene; copolymers obtained by copolymerization of a monomer mixture including tetrafluoroethylene and at least one kind of comonomer; fluorine-containing copolymers having a ring structure on the copolymer backbone thereof; water absorptive materials having a water absorption of 1% or more; moisture-proof materials having a water absorption of 0.1% or less; and the like.

A process of forming the protective layer is not particularly limited. Examples of such method to be used include a vacuum deposition process, a sputtering process, a reactive sputtering process, a MBE (molecular beam epitaxy) process, a cluster ion beam process, a ion plating process, a plasma polymerization process (the high-frequency excited ion plating process), a plasma CVD process, a laser CVD process, a thermal CVD process, a gas source CVD process, a coating process, a printing process, a the transfer process.

Others

Furthermore, in the invention, the entire element may be sealed with a sealing container. Also, the space between the sealing container and the light emitting element may be filled with a moisture absorbent or an inert liquid.

A moisture absorbent is not particularly limited. Specific examples of the moisture absorbent include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, a molecular sieve, zeolite, magnesium oxide, and the like.

An inert liquid is not particularly limited and the examples include paraffins, liquid paraffins, fluorine-based solvents such as perfluoroalkanes, perfluoroamines and perfluoroethers, chlorine-based solvents, and silicone oils.

The light emitting element of the invention can obtain light emission by the application of a direct (as required, an alternating component may be contained) voltage (normally 2 volts to 40 volts) or a direct current across the above-described anode and the above-described cathode.

The driving of a light emitting element of the invention can utilize methods described in JP-A Nos. 2-148687, 6-301355, 5-29080, 7-134558, 8-234685 and 8-241047, U.S. Pat. Nos. 5,828,429 and 602330, Japanese Patent No. 2784615, etc.

EXAMPLES

Hereinafter, a light emitting element of the invention will be explained with reference to the following examples. However, the following examples should not be construed to limit the scope of the invention. Also, the constitution of the invention can be applied not only to the compounds used in the Examples, but also to a variety of compounds.

Example 1

On a glass substrate having a thickness of 0.5 mm and a square side of 2.5 cm, an ITO thin film (thickness: 0.2 μm), i.e., a transparent anode, was formed by use of an ITO target having an $In_2O_3$ content of 95% by mass by DC magnetron sputtering (conditions: substrate temperature 100° C., oxygen pressure $1 \times 10^{-3}$ Pa).

Then, the substrate on which the resulting transparent anode was formed was placed in a washing vessel, and the substrate was washed with 2-propanol, and subsequently this was subjected to UV-ozone treatment for 30 minutes.

On the transparent anode of the substrate subjected to this UV-ozone treatment, copper phthalocyanine (CuPc) and 4,4'-bis[N-(1-naphthyl)-N-phenyl-amino]biphenyl (NPD), i.e., a hole transporting layer, were deposited by the vacuum deposition method at an average speed of 0.4 nm/sec each to thicknesses of 10 nm and 50 nm, respectively.

Thereon, tris(8-hydroxyquinolinato) aluminum (Alq), i.e., a charge transport material, and light emitting material A (the following structure) were simultaneously deposited under vacuum, thereby making a light emitting layer. At the time, light emitting material A was deposited to a thickness of 2 nm so that the concentration of the material was 0.3% by mass, and then the material was deposited another 2 nm so that the concentration was 2% by mass. This procedure was repeated to form a light emitting layer so that the total thickness of the light emitting layer was 40 nm.

Thereon, Alq was deposited as an electron transporting layer under vacuum to 20 nm and lithium fluoride was deposited thereon another 1 nm as an electron injecting layer and then further aluminum as a cathode was deposited thereon another 200 nm.

As described above, the light emitting element of Example 1 was fabricated.

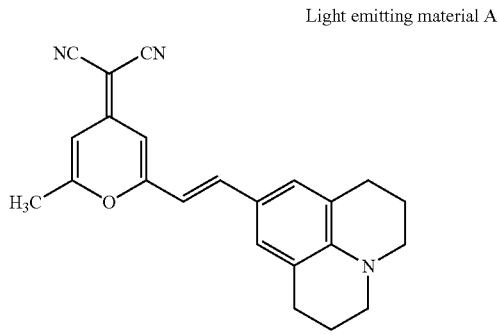

Light emitting material A

The wave pattern of light emitting spectrum of the light emitting element thus fabricated was determined by means of a Multi-Channel-Analyzer PMA-11 manufactured by Hamamatsu Photonics K.K. The value of the wavelength of the light emitting peak was measured. Also, the external quantum efficiency was calculated from this light emitting spectrum wave pattern and the current and luminescence during measurement.

Example 2

On a transparent anode formed on a substrate subjected to similar treatment as described in Example 1, CuPc and NPD as a hole transporting layer were deposited by the vacuum deposition method at an average speed of 0.4 nm/sec each to thicknesses of 10 nm and 50 nm, respectively.

Thereon, Alq and light emitting material A were simultaneously deposited under vacuum, thereby making a light emitting layer. At the time, light emitting material A was deposited to a thickness of 4 nm so that the concentration of the material was 0.3% by mass, and then light emitting material A was deposited another 4 nm so that the concentration of the material was 2% by mass. This procedure was repeated to form a light emitting layer so that the total thickness of the light emitting layer was 40 nm.

Thereon, Alq was deposited as an electron transporting layer under vacuum to 20 nm and lithium fluoride as an electron injecting layer was deposited thereon another 1 nm and then aluminum as a cathode was deposited thereon another 200 nm.

As described above, the light emitting element of Example 2 was fabricated.

The light emitting element thus obtained was measured for a light emitting spectrum as described in Example 1 and the external quantum efficiency was calculated.

Example 3

On a transparent anode formed on a substrate subjected to similar treatment as described in Example 1, CuPc and NPD as a hole transporting layer were deposited by the vacuum deposition method at an average speed of 0.4 nm/sec each to thicknesses of 10 nm and 50 nm, respectively.

Thereon, Alq and light emitting material A were simultaneously deposited under vacuum, thereby making a light emitting layer. At the time, light emitting material A was deposited to a thickness of 10 nm so that the concentration of the material was 0.3% by mass, and then light emitting material A was deposited another 10 nm so that the concentration of the material was 2% by mass. This procedure was repeated to form a light emitting layer so that the total thickness of the light emitting layer was 40 nm.

Thereon, Alq was deposited as an electron transporting layer under vacuum to 20 nm and lithium fluoride as an electron injecting layer was deposited thereon another 1 nm and then aluminum as a cathode was deposited thereon another 200 nm.

As described above, the light emitting element of Example 3 was fabricated.

The light emitting element thus obtained was measured for a light emitting spectrum as described in Example 1 and the external quantum efficiency was calculated.

Example 4

On a transparent anode formed on a substrate subjected to similar treatment as described in Example 1, CuPc and NPD as a hole transporting layer were deposited by the vacuum deposition method at an average speed of 0.4 nm/sec each to thicknesses of 10 nm and 50 nm, respectively.

Thereon, Alq and light emitting material A were simultaneously deposited under vacuum, thereby making a light emitting layer. At the time, light emitting material A was deposited to a thickness of 2 nm so that the concentration of the material was 0.3% by mass, then light emitting material A was deposited another 2 nm so that the concentration of the material was 1% by mass, and then light emitting material A was deposited another 2 nm so that concentration of the material was 2% by mass. This procedure was repeated to form a light emitting layer so that the total thickness of the light emitting layer was 60 nm.

Thereon, Alq was deposited as an electron transporting layer under vacuum to 20 nm and lithium fluoride as an electron injecting layer was deposited thereon another 1 nm and then aluminum as a cathode was deposited thereon another 200 nm.

As described above, the light emitting element of Example 4 was fabricated.

The light emitting element thus obtained was measured for a light emitting spectrum as described in Example 1 and the external quantum efficiency was calculated.

Example 5

On a transparent anode formed on a substrate subjected to similar treatment as described in Example 1, CuPc and NPD as a hole transporting layer were deposited by the vacuum deposition method at an average speed of 0.4 nm/sec each to thicknesses of 10 nm and 50 nm, respectively.

Thereon, Alq and light emitting material A were simultaneously deposited under vacuum, thereby making a light emitting layer. At the time, light emitting material A was deposited to a thickness of 2 nm so that the concentration of the material was 1.2% by mass, and then light emitting material A was deposited another 4 nm so that the concentration of the material was 2% by mass. This procedure was repeated to form a light emitting layer so that the total thickness of the light emitting layer was 40 nm.

Thereon, Alq was deposited as an electron transporting layer under vacuum to 20 nm and lithium fluoride as an electron injecting layer was deposited thereon another 1 nm and then aluminum as a cathode was deposited thereon another 200 nm.

As described supra, the light emitting element of Example 5 was fabricated.

The light emitting element thus obtained was measured for a light emitting spectrum as described in Example 1 and the external quantum efficiency was calculated.

Comparative Example 1

On a transparent anode formed on a substrate subjected to similar treatment as described in Example 1, CuPc and NPD as a hole transporting layer were deposited by the vacuum deposition method at an average speed of 0.4 nm/sec each to thicknesses of 10 nm and 50 nm, respectively.

Thereon, Alq and light emitting material A were simultaneously deposited under vacuum, thereby making a light emitting layer. At the time, a light emitting layer was formed so that the concentration of emitting material A was 0.3% by mass and so that the thickness of the layer was 40 nm.

Thereon, Alq was deposited as an electron transporting layer under vacuum to 20 nm and lithium fluoride as an electron injecting layer was deposited thereon another 1 nm and then aluminum as a cathode was deposited thereon another 200 nm.

As described above, the light emitting element of Comparative Example 1 was fabricated.

The light emitting element thus obtained was measured for a light emitting spectrum as described in Example 1 and the external quantum efficiency was calculated.

Comparative Example 2

On a transparent anode formed on a substrate subjected to similar treatment as described in Example 1, CuPc and NPD as a hole transporting layer were deposited by the vacuum deposition method at an average speed of 0.4 nm/sec each to thicknesses of 10 nm and 50 nm, respectively.

Thereon, Alq and light emitting material A were simultaneously deposited under vacuum, thereby making a light emitting layer. At the time, a light emitting layer was formed so that the concentration of emitting material A was 2% by mass and so that the thickness of the layer was 40 nm.

Thereon, Alq was deposited as an electron transporting layer under vacuum to 20 nm and lithium fluoride as an electron injecting layer was deposited thereon another 1 nm and then aluminum as a cathode was deposited thereon another 200 nm.

As described above, the light emitting element of Comparative Example 2 was fabricated.

The light emitting element thus obtained was measured for a light emitting spectrum as described in Example 1 and the external quantum efficiency was calculated.

Table 1 below tabulates the results of the peak wavelengths and external quantum efficiencies of the light emitting elements obtained in Examples 1 to 5 and Comparative Examples 1 and 2.

TABLE 1

| | External quantum efficiency (%) | Peak wavelength (nm) |
| --- | --- | --- |
| Example 1 | 1.09 | 613 |
| Example 2 | 1.05 | 614 |
| Example 3 | 0.97 | 611 |
| Example 4 | 0.92 | 616 |
| Example 5 | 0.82 | 612 |
| Comparative Example 1 | 1.01 | 599 |
| Comparative Example 2 | 0.62 | 614 |

Table 1 shows that the peak wavelengths of the light emitting elements of Examples 1 to 4 are located at long wavelengths as compared with that of the light emitting element of Comparative Example 1, which does not have the structure of the invention, and the light emitting elements of Examples 1 to 4 also have high quantum efficiencies as compared with that of the element of Comparative Example 2. This suggests that the light emitting elements of Examples 1 to 4 have almost the same level of efficiency as that of Comparative Example 1, and exhibit calorimetric purity as good as that of the element of Comparative Example 2 at almost the same wavelength. From the light emitting element of Example 5, it is obviously preferable that the concentration of the light emitting material contained in a high concentration layer is at least twice that of the light emitting material contained in a low concentration layer in a repeat structure of a high concentration layer and a low concentration layer.

Example 6

On a transparent anode formed on a substrate subjected to similar treatment as described in Example 1, CuPc and NPD as a hole transporting layer were deposited by the vacuum deposition method at an average speed of 0.4 nm/sec each to thicknesses of 10 nm and 50 nm, respectively.

Thereon, the following compound B as a charge transport material and light emitting material A were simultaneously deposited under vacuum, thereby making a light emitting layer. At the time, light emitting material A was deposited to a thickness of 2 nm so that the concentration of the material was 0.3% by mass, and then light emitting material A was deposited another 2 nm so that the concentration of the material was 2% by mass. This procedure was repeated to form a light emitting layer so that the total thickness of the light emitting layer was 40 nm.

Thereon, Alq was deposited as an electron transporting layer under vacuum to 20 nm and lithium fluoride as an electron injecting layer was deposited thereon another 1 nm and then aluminum as a cathode was deposited thereon another 200 nm.

As described above, the light emitting element of Example 6 was fabricated.

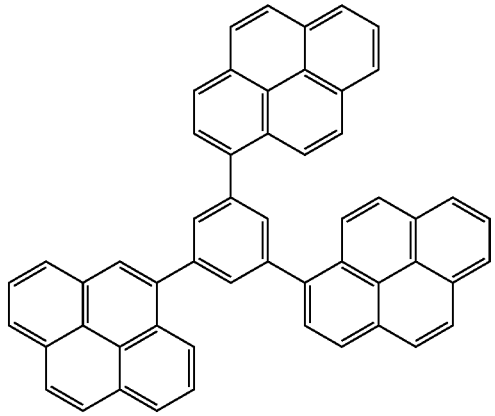

Compound B

The light emitting element thus obtained was measured for a light emitting spectrum as described in Example 1 and the external quantum efficiency was calculated.

Comparative Example 3

On a transparent anode formed on a substrate subjected to similar treatment as described in Example 1, CuPc and NPD as a hole transporting layer were deposited by the vacuum deposition method at an average speed of 0.4 nm/sec each to thicknesses of 10 nm and 50 nm, respectively.

Thereon, compound B of a charge transport material and light emitting material A were simultaneously deposited under vacuum, thereby making a light emitting layer. At the time, a light emitting layer was formed so that the concentration of emitting material A was 0.3% by mass and so that the thickness of the layer was 40 nm.

Thereon, Alq was deposited as an electron transporting layer under vacuum to 20 nm and lithium fluoride as an electron injecting layer was deposited thereon another 1 nm and then aluminum as a cathode was deposited thereon another 200 nm.

As described supra, the light emitting element of Comparative Example 3 was fabricated.

The light emitting element thus obtained was measured for a light emitting spectrum as described in Example 1 and the external quantum efficiency was calculated.

Comparative Example 4

On a transparent anode formed on a substrate subjected to similar treatment as described in Example 1, CuPc and NPD as a hole transporting layer were deposited by the vacuum deposition method at an average speed of 0.4 nm/sec each to thicknesses of 10 nm and 50 nm, respectively.

Thereon, compound B as a charge transport material and light emitting material A were simultaneously deposited under vacuum, thereby making a light emitting layer. At the time, a light emitting layer was formed so that the concentration of emitting material A was 2% by mass and so that the thickness of the layer was 40 nm.

Thereon, Alq was deposited as an electron transporting layer under vacuum to 20 nm and lithium fluoride as an electron injecting layer was deposited thereon another 1 nm and then aluminum as a cathode was deposited thereon another 200 nm.

As described above, the light emitting element of Comparative Example 4 was fabricated.

The light emitting element thus obtained was measured for a light emitting spectrum as described in Example 1 and the external quantum efficiency was calculated.

Table 2 below tabulates the results of the peak wavelengths and external quantum efficiencies of the light emitting elements obtained in Example 6 and Comparative Examples 3 and 4.

TABLE 2

|  | External quantum efficiency (%) | Peak wavelength (nm) |
| --- | --- | --- |
| Example 6 | 0.99 | 615 |
| Comparative Example 3 | 0.97 | 603 |
| Comparative Example 4 | 0.58 | 612 |

Table 2 shows that the peak wavelength of the light emitting element of Example 6 is located at a long wavelength as compared with that of the light emitting element of Comparative Example 3, which does not have the structure of the invention, and that the light emitting element of Example 6 also has a high quantum efficiency as compared with that of the element of Comparative Example 4. This suggests that even use of a substance exclusive of Alq as a charge transport material to be used in a luminescent layer can provide the efficacy of the invention.

Example 7

On a transparent anode formed on a substrate subjected to similar treatment as described in Example 1, CuPc and NPD as a hole transporting layer were deposited by the vacuum deposition method at an average speed of 0.4 nm/sec each to thicknesses of 10 nm and 50 nm, respectively.

Thereon, Alq and compound B as charge transport materials and light emitting material A were simultaneously deposited under vacuum, thereby making a light emitting layer. At the time, Alq, compound B and light emitting material A were deposited to 2 nm in such a way that the ratio of Alq to compound B to light emitting material A was 50:50:0.3 and then the materials were deposited to 2 nm in such a that the ratio of Alq to compound B to light emitting material A was 50:50:2. This procedure was repeated to form a light emitting layer in such a way that the total thickness of the light emitting layer was 40 nm.

Thereon, Alq was deposited as an electron transporting layer under vacuum to 20 nm and lithium fluoride as an electron injecting layer was deposited thereon another 1 nm and then aluminum of a cathode was deposited thereon another 200 nm.

As described supra, the light emitting element of Example 7 was fabricated.

The light emitting element thus obtained was measured for a light emitting spectrum as described in Example 1 and the external quantum efficiency was calculated.

Comparative Example 5

On a transparent anode formed on a substrate subjected to similar treatment as described in Example 1, CuPc and NPD as a hole transporting layer were deposited by the vacuum deposition method at an average speed of 0.4 nm/sec each to thicknesses of 10 nm and 50 nm, respectively.

Thereon, Alq and compound B as charge transport materials and light emitting material A were simultaneously deposited under vacuum, thereby making a light emitting layer. At the time, a light emitting layer was formed in such a way that the ratio of Alq to charge transport material B to light emitting material A was 50:50:0.3 and in such a way that the thickness of the layer was 40 nm.

Thereon, Alq was deposited as an electron transporting layer under vacuum to 20 nm and lithium fluoride as an electron injecting layer was deposited thereon another 1 nm and then aluminum as a cathode was deposited thereon another 200 nm.

As described above, the light emitting element of Comparative Example 5 was fabricated.

The light emitting element thus obtained was measured for a light emitting spectrum as described in Example 1 and the external quantum efficiency was calculated.

Comparative Example 6

On a transparent anode of a substrate subjected to similar treatment as described in Example 1, CuPc and NPD as a hole transporting layer were deposited by the vacuum deposition method at an average speed of 0.4 nm/sec each to thicknesses of 10 nm and 50 nm, respectively.

Thereon, Alq and compound B as charge transport materials and light emitting material A were simultaneously deposited under vacuum, thereby making a light emitting layer. At the time, a light emitting layer was formed in such a way that the ratio of Alq to charge transport material B to light emitting material A was 50:50:2 and in such a way that the thickness of the layer was 40 nm.

Thereon, Alq was deposited as an electron transporting layer under vacuum to 20 nm and lithium fluoride as an electron injecting layer was deposited thereon another 1 nm and then aluminum as a cathode was deposited thereon another 200 nm.

As described above, the light emitting element of Comparative Example 6 was fabricated.

The light emitting element thus obtained was measured for a light emitting spectrum as described in Example 1 and the external quantum efficiency was calculated.

Table 3 below tabulates the results of the peak wavelengths and external quantum efficiencies of the light emitting elements obtained in Example 7 and Comparative Examples 5 and 6.

TABLE 3

|  | External quantum efficiency (%) | Peak wavelength (nm) |
| --- | --- | --- |
| Example 7 | 1.00 | 613 |
| Comparative Example 5 | 1.01 | 601 |
| Comparative Example 6 | 0.60 | 615 |

Table 3 shows that the peak wavelength of the light emitting element of Example 7 is located at a long wavelength as compared with that of the light emitting element of Comparative Example 5, which does not have the structure of the invention, and that the light emitting element of Example 7 also has a high quantum efficiency as compared with that of the element of Comparative Example 6. This suggests that even use of two or more materials as charge transport materials to be used in a luminescent layer can provide the efficacy of the invention.

What is claimed is:

1. A light emitting element comprising a pair of electrodes and one or more organic compound layers including a luminescent layer disposed between the pair of electrodes,
wherein the luminescent layer includes two or more laminates and each laminate is a repeating unit consisting of a plurality of layers,
wherein at least one of the same charge transport material is included in each of the plurality of layers and at least one of the same light emitting material is included in the plurality of layers,
wherein respective layers of the repeating unit include the light emitting material at different concentrations, and wherein the concentration of the light emitting materials in a layer having the highest concentration of the light emitting material is at least twice that of the light emitting material in a layer having the lowest concentration of the light emitting material.

2. The light emitting element of claim 1, wherein the concentrations of the light emitting material included in the plurality of layers including the light emitting material in different concentrations are each from 0.01% by mass to 5% by mass.

3. The light emitting element of claim 1, wherein the concentration of the light emitting material in a layer including the light emitting material in a highest concentration is at least five times that of the light emitting material in a layer including the light emitting material in a lowest concentration.

4. The light emitting element of claim 1, wherein the concentration of the light emitting material in the layer including the light emitting material in a highest concentration is from 0.1% by mass to 5% by mass;
the concentration of the light emitting material in the layer including the light emitting material in a lowest concentration is from 0.01% by mass to 2% by mass; and
the concentration of the light emitting material in the layer having the highest concentration of the light emitting material is at least twice that of the light emitting material in the layer having the lowest concentration of the light emitting material.

5. The light emitting element of claim 1, wherein thicknesses of the layer including the light emitting material in a highest concentration and the layer including the light emitting material in a lowest concentration are each from 1 nm to 10 nm.

6. The light emitting element of claim 1, wherein the total thickness of the luminescent layer is from 10 nm to 100 nm.

7. The light emitting element of claim 1, wherein the number of the repeating units forming the luminescent layer is from 2 to 50.

8. The light emitting element of claim 1, wherein the luminescent layer includes at least one charge transport material and only one light emitting material.

9. The light emitting element of claim 1, wherein the light emitting material comprises at least one selected from a fluorescence emitting compound and a phosphorescence emitting compound having a maximum peak emission wavelength in a range of 570 nm or more to 700 nm or less.

10. The light emitting element of claim 1, wherein the charge transport material comprises at least one selected from the group consisting of benzoxazole, benzomidazole, benzothiazole, styryl benzene, polyphenyl, diphenylbutadiene, tetraphenylbutadiene, naphthalimide, coumarin, pyrene, perylene, perinone, oxadiazole, aldazine, pyralyzine, cyclopentadiene, bisstyrylanthracene, quinacridone, pyrrolopyridine, thiadiazopyridine, styrylamine, aromatic dimethylidyne compounds, metal complexes of 8-quinolinol, polythiophene, polyphenylene, polyphenylenevinylene, organic silanes, and derivatives thereof.

11. The light emitting element of claim 1 wherein the content ratio of the charge transport material and the light emitting material is from 10,000:1 to 100:20 by mass.

12. The light emitting element of claim 1, wherein a peak of an emission wavelength of the light emitting element is 570 nm or more.

13. The light emitting element of claim 7, wherein the number of the repeating units forming the luminescent layer is from 3 to 25.

14. The light emitting element of claim 1, wherein the repeating units forming the luminescent layer each consist of two layers.

15. A light emitting element comprising a pair of electrodes and one or more organic compound layers including a luminescent layer disposed between the pair of electrodes, wherein the luminescent layer includes two or more laminates and each laminate is a repeating unit comprising a plurality of layers, wherein at least one of the same charge transport material is included in each of the plurality of layers and at least one of the same light emitting material is included in the plurality of layers, wherein respective layers of the repeating unit include the light emitting material at different concentrations, and wherein the concentration of the light emitting materials in a layer having the highest concentration of the light emitting material is at least twice that of the light emitting material in a layer having the lowest concentration of the light emitting material.

* * * * *